(12) United States Patent
Oda

(10) Patent No.: US 7,671,608 B2
(45) Date of Patent: Mar. 2, 2010

(54) ELECTRICAL JUNCTION BOX

(75) Inventor: Akihiro Oda, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 211 days.

(21) Appl. No.: 11/902,294

(22) Filed: Sep. 20, 2007

(65) Prior Publication Data

US 2008/0068032 A1    Mar. 20, 2008

(30) Foreign Application Priority Data

Sep. 20, 2006    (JP) .............................. 2006-254536

(51) Int. Cl.
*G01R 27/08* (2006.01)
*G01R 31/04* (2006.01)
(52) U.S. Cl. .................. 324/724; 324/538; 439/76.2
(58) Field of Classification Search ................. 324/724, 324/538; 439/76.2
See application file for complete search history.

(56) References Cited

U.S. PATENT DOCUMENTS

| | | | | |
|---|---|---|---|---|
| 5,444,387 A | * | 8/1995 | Van Loan et al. | 324/754 |
| 5,755,579 A | * | 5/1998 | Yanase et al. | 439/76.2 |
| 6,283,800 B2 | * | 9/2001 | Sasaki et al. | 324/158.1 |
| 6,428,341 B2 | * | 8/2002 | Kinezuka et al. | 324/538 |
| 6,780,026 B2 | * | 8/2004 | Sato | 439/76.2 |
| 2002/0061666 A1 | * | 5/2002 | Sato | 439/76.2 |
| 2002/0109513 A1 | * | 8/2002 | Wilk | 324/754 |

FOREIGN PATENT DOCUMENTS

| JP | A 10-032914 | 2/1998 |
|---|---|---|
| JP | A 2005-065421 | 3/2005 |
| JP | A 2005-326271 | 11/2005 |

* cited by examiner

*Primary Examiner*—Timothy J Dole
(74) *Attorney, Agent, or Firm*—Oliff & Berridge, PLC

(57) ABSTRACT

An electrical junction box is adapted to be set in a conductivity inspection device. The conductivity inspection device includes a sensing pin assembly and guide pins, the guide pins extending beyond the sensing pin assembly. The electrical junction box includes a casing including a containing section and at least two guide holes formed in a surface wall of the casing, the guide holes being spaced away from each other by a given distance. The casing is shaped such that when the electric junction box is set in the conductivity inspection device, the guide pins are inserted into the guide holes before the sensing pin assembly is inserted into the containing section.

2 Claims, 11 Drawing Sheets

ELECTRICAL JUNCTION BOX

This application claims priority from Japanese Patent Application No. 2006-254536 filed in the Japanese Patent Office on Sep. 20, 2006, the disclosure of which is incorporated herein by reference in its entirety.

BACKGROUND

This invention relates to an electrical junction box. In embodiments, the invention more particularly relates to an electrical junction box that can reliably carry out a conductivity inspection for a terminal that projects from a bottom wall in a fuse, a relay, or a connector containing section of the box and can positively effect a conductivity sensing and a half-fitting sensing for the terminal, in the case where a fitting inspection between the terminal and a lance for holding the terminal is carried out by inserting a sensing pin assembly projecting from a conductivity inspection device into the containing section, without breaking the sensing pin assembly.

In a process for manufacturing an electrical junction box, a conductivity inspection may be conducted to confirm whether or not an internal connection has failed. Failures can include, but are not limited to, failures such as a short circuit, an open circuit, miswiring, or the like. For example, FIGS. 7 and 8 show an example of a related-art conductivity inspection process. A conductivity inspection device 1 includes a plurality of sensing pins 1a attached to a support plate 1b at a given pitch. The electrical junction box is subsequently set in the conductivity inspection device 1 where the sensing pins 1a are inserted into fuse containing sections 2 of the electrical junction box. When the sensing pins 1a contact mating terminals 3 that are inserted upward into and secured to the fuse containing sections 2, the conductivity inspection begins (see JP 2005-326271A).

Also, a terminal connected to an end of a wire harness may be inserted into the fuse containing section of the electrical junction box so that the wire harness terminal is coupled to a terminal of a fuse mounted in the fuse containing section. In this case, as shown in FIG. 9, an engaging projection 3a-1 on a side portion of a metal lance 3a of the inserted wire harness terminal 3 is engaged with an engaging recess 2a-1 of a resin lance 2a integrated with the fuse containing section 2. Additionally, the resin lance 2a is fitted on the wire harness terminal 3 to secure the wire harness terminal 3 at a regular position in the fuse containing section 2.

Similarly, a wire harness terminal to be inserted into a relay or connector containing section is positioned by a resin lance.

Accordingly, when a terminal is positioned and held in a fuse containing section or the like of the electrical junction box by a resin lance, a fitting inspection for detecting a failure in fitting (half-fitting) between the resin lance and the terminal can also be performed along with the conductivity inspection. The fitting inspection utilizes a conductivity inspection device 1 as shown, for example, in FIG. 10. The conductivity inspection device 1 includes a plurality of sensing pin assemblies 1a having a plurality of conductivity sensing pins 1a-1 and half-fitting pins 1a-2.

As shown in FIG. 11, if the resin lance 2a is inclined inward under a half-fitting condition between the terminal 3 and the resin lance 2a, the half-fitting sensing pin 1a-2 inserted down into the fuse containing section 2 contacts with the inward inclined resin lance 2a, thereby detecting the half-fitting. Also, since the half-fitting sensing pin 1a-2 cannot enter a gap between two resin lances 2a, the conductivity sensing pin 1a-1 cannot reach a top surface 3a-2 of the metal lance 3a, thereby disabling the conductivity sensing.

On the other hand, as shown in FIG. 12, when the engaging projection 3a-1 on the metal lance 3a of the terminal 3 engages the engaging recess 2a-1 of the resin lance 2a, and the terminal 3 and resin lance 2a are under a fitting condition, the half-fitting sensing pin 1a-2 inserted down into the fuse containing section 2 enters the gap between the two resin lances 2a. This is due to the resin lance 2a standing straight and not being inclined inward. As a result, the conductivity sensing pin 1a-1 contacts with the top surface 3a-2 of the metal lance 3a of the terminal 3, thereby enabling the conductivity sensing.

In other words, if the conductivity sensing pin 1a-1 detects conductivity, one can determine that the terminal 3 and the resin lance 2a are under a fitting condition.

On the other hand, when an electrical junction box is set in a conductivity inspection device in which a plurality of pairs of two pins (a conductivity sensing pin 1a-1 and a half-fitting sensing pin 1a-2) constituting a plurality of sensing pin assemblies 1a are projected, a working person manually inserts an electrical junction box 4 into a conductivity inspection device 1 in a direction shown by arrow A in FIG. 13 while sliding an outer wall surface 4a of the electrical junction box 4 onto an inner wall surface 1b of the conductivity inspection device 1. When the electrical junction box 4 is inserted perfectly so as to reach an inner part in the conductivity inspection device 1, doors 1c provided on the opposite sides of the conductivity inspection device 1 are closed.

However, as described above, since the electrical junction box 4 is set manually in the conductivity inspection device 1, the electrical junction box can be improperly (i.e., obliquely) inserted into the device upon setting. In this case, the conductivity sensing pin 1a-1 or the half-fitting sensing pin 1a-2 projected from the conductivity inspection device 1 may be inserted at an angle into the fuse containing section 2 or the like, thereby being broken. In particular, the greater the number of conductivity sensing pins 1a-1 and half-fitting sensing pins 1a-2 projected from the conductivity inspection device 1, the more conductivity sensing pins may be broken or deformed. Consequently, if the pins are deformed, it is impossible to conduct effective fitting and conductivity inspections.

SUMMARY

In view of the above problems, an object of exemplary embodiments of the present invention is to provide an electrical junction box that can reliably conduct a conductivity sensing and a half-fitting sensing without breaking a conductivity sensing pin and/or a half-fitting sensing pin when the electrical junction box is set in a conductivity inspection device. The conductivity inspection device includes a sensing pin assembly from which the conductivity sensing pin and half-fitting sensing pin are projected. These conductivity and half-fitting sensing pins are inserted down into a fuse containing section or the like of the electrical junction box, and a terminal inserted and fixed in the containing section is subject to a conductivity inspection and a half-fitting inspection.

In order to solve the above problems, exemplary embodiments of the present invention are directed to an electrical junction box adapted to be set at a regular position in a conductivity inspection device. A sensing pin assembly projecting from the conductivity inspection device includes a conductivity sensing pin and a half-fitting sensing pin. When the sensing pin assembly is inserted into a containing section for a fuse, a relay, a connector, or a terminal in the containing section is subject to a conductivity inspection and a half-fitting inspection. Exemplary embodiments of the electrical junction box include: at least two guide holes formed in a surface wall of a casing provided with the containing section and spaced away from each other by a given distance; and guide pins that extend beyond the sensing pin assembly in the conductivity inspection device and are inserted into the guide holes, before the sensing pin assembly is inserted into the containing section.

As described above, at least two guide holes are formed in the surface wall of the casing provided with the containing section of the electrical junction box; the guide pins projected from the conductivity inspection device over the sensing pin assembly including the conductivity and half-fitting sensing pins are inserted into the guide holes; and the electrical junction box is positioned and set in the conductivity inspection device. That is, at least two guide holes are formed in the surface wall of the casing so that when the guide pins project from the guide holes all of the sensing pins are inserted into the containing section at the regular positions. Accordingly, merely by inserting the guide pins into and projecting them from the guide holes, all sensing pins are inserted into the containing section at the regular positions without being inserted at an angle. Thus, since the electrical junction box is positioned and set in the conductivity inspection device, it is possible to effectively prevent the sensing pins from being broken and to reliably carry out the half-fitting sensing and conductivity sensing.

An amount of projecting the guide pin of the conductivity inspection device from the guide hole can be set to be about a length by which the guide pin has extended already over the guide hole when the sensing pin assembly including the conductivity sensing pin and half-fitting sensing pin is inserted in the containing section.

Preferably, a diameter of the guide hole formed in the surface wall of the casing can have a clearance sufficient to automatically define an inserting position of the sensing pins without causing a play upon passing while the guide pins are allowed to move smoothly.

Also, two guide holes can be formed in the surface wall of the casing and spaced away from each other at empty spaces that do not affect a wiring in the electrical junction box. When the guide pines are inserted into the guide holes, the electrical junction box can be set in the conductivity inspection device at the regular position.

Preferably, the number of guide holes is two.

Preferably, the containing section is provided on a peripheral wall with an arcuate recess for guiding the conductivity sensing pin adapted to contact with a distal end surface of the terminal. The conductivity sensing pin guided by the recess can reach the distal end surface of the terminal to enable the conductivity sensing in the case where the terminal is fixed at a regular position in the containing section. The conductivity sensing pin guided by the recess cannot reach the distal end surface of the terminal to disenable the conductivity sensing in the case where the terminal is not fixed at the regular position in the containing section.

As described above, in the prior art, the conductivity state has been detected when the conductivity sensing pin $1a$-$1$ contacts with the metal lance $3a$ of the terminal $3$. As shown in FIG. 14, even if the terminal $3$ is not fitted in the resin lances $2a$ at the regular position and the metal lance $3a$ of the terminal $3$ are caught on a lower part of the engaging recess $2a$-$1$ on the resin lance $2a$, the half-fitting sensing pin $1a$-$2$ enters a gap between two resin lances $2a$ when the terminal $3$ is inclined at a slight angle. The conductivity sensing pin $1a$-$1$ does not contact with the metal lance $3a$ by which a conductivity state should be checked primarily but contacts with the side surface $3b$ of the terminal $3$ on account of a slight inclination of the terminal $3$. This results in conductivity being detected, and therefore a worker performing a fitting and conductivity inspections may mistakenly judge the assembly to be acceptable even though the terminal $3$ and resin lances $2a$ are under the half-fitting condition.

As described above, the containing section is provided on the peripheral wall with the arcuate recess for guiding the conductivity sensing pin, and the conductivity sensing pin guided by the recess can detect the conductivity state at the distal end surface of the terminal. Thus, when the metal lance of the terminal is positioned below the engaging recess of the resin lance (i.e., the terminal is under the half-fitting condition), the conductivity sensing pin cannot reach the distal end surface of the terminal and the conductivity sensing pin does not contact with the side surface of the terminal. Accordingly, the conductivity state cannot be detected. Thus, even in a half-fitting condition, it is possible to reduce the possibility that a worker will mistakenly judge the assembly to be acceptable. That is, according to the above construction, only in the case where the terminal is secured at the regular position in the electrical junction box, the conductivity sensing pin guided by the recess can reach the distal end surface of the terminal, thereby detecting the conductivity state.

As described above, according to exemplary embodiments of the present invention, at least two guide holes are formed in the surface wall of the casing provided with the containing section of the electrical junction box; the guide pins projected from the conductivity inspection device over the sensing pin assembly including the conductivity and half-fitting sensing pins are inserted into the guide holes; all sensing pins are inserted into the containing section at the regular positions merely by inserting the guide pins into the guide holes and projecting the guide pins from the guide holes; and the electrical junction box is positioned and set in the conductivity inspection device without causing all sensing pins to be inserted obliquely. Thus, it is possible to effectively prevent the sensing pins from being broken and to reliably carry out the half-fitting sensing and conductivity sensing.

Also, as described above, the containing section is provided on the peripheral wall with the arcuate recess for guiding the conductivity sensing pin and the conductivity sensing pin guided by the recess can detect the conductivity state at the distal end surface of the terminal. In results, in the case where the metal lance of the terminal is positioned below the engaging recess of the resin lance, that is, the terminal is under the half-fitting state, the conductivity sensing pin cannot reach the distal end surface of the terminal and the conductivity sensing pin does not contact with the side surface of the terminal. Accordingly, the conductivity state cannot be detected. Even in a half-fitting condition, it is possible to reduce the possibility that a worker will mistakenly judge the assembly to be acceptable. That is, according to the above construction, only in the case where the terminal is secured in the electrical junction box at the regular position, the conductivity sensing pin guided by the recess can reach the distal end surface of the terminal, thereby detecting the conductivity state.

BRIEF DESCRIPTION OF THE DRAWINGS

Exemplary embodiments of the invention will be described below with reference to the drawings, wherein like numerals represent like parts, and wherein.

DETAILED DESCRIPTION

Figure 1:
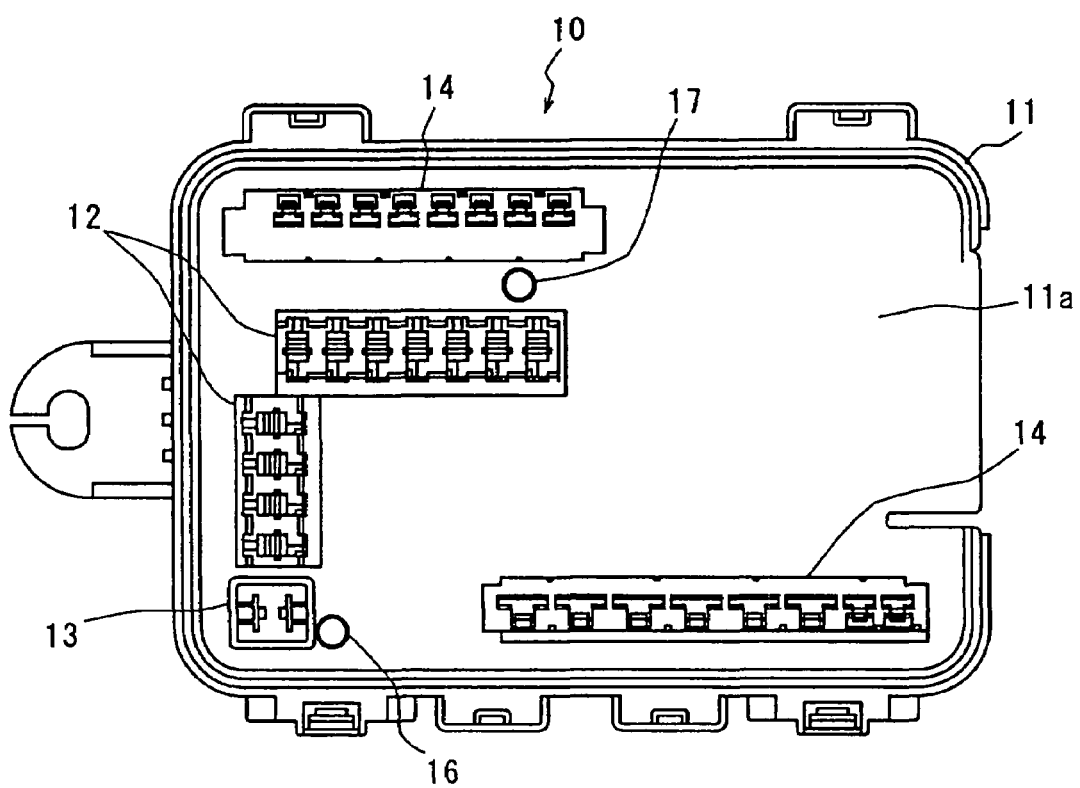
FIG. 1 is a schematic plan view of an embodiment of an electrical junction box in accordance with the present invention.

An exemplary embodiment of an electrical junction box in accordance with the present invention will be described below by referring to the drawings.

Figure 2:
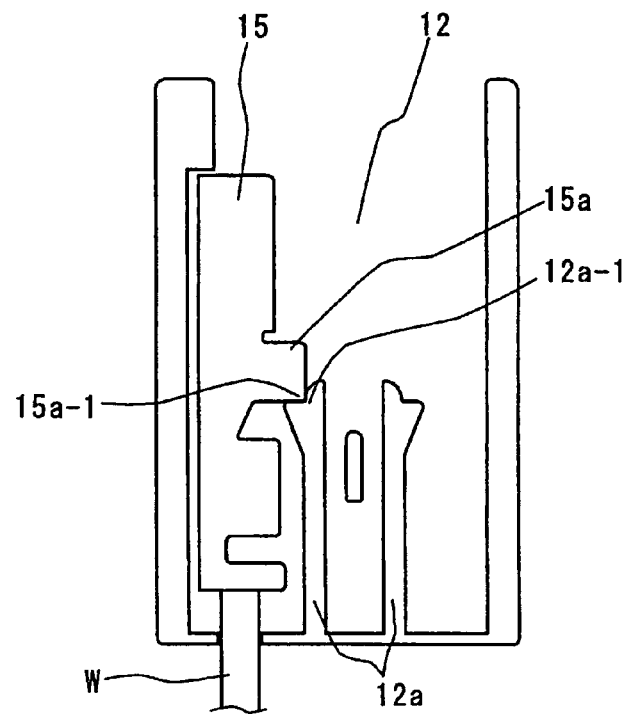
FIG. 2 is an explanatory view, illustrating a fitting state between a terminal and a lance in a fuse containing section.

FIGS. 1 through 6 show an embodiment of an electrical junction box in accordance with the present invention. As shown in FIG. 1, an electrical junction box 10 includes a fuse containing section 12, a relay containing section 13, and a connector containing section 14 provided on a top wall 11a of a casing 11. Fuses, relays, and connectors (not shown) are mounted in these containing sections 12, 13, and 14, respectively. A terminal 15 is connected to a distal end of a wire harness W accommodated in the casing 11 (see FIG. 2). The terminal 15 is inserted into the fuse containing section 12 and is connected to a terminal of a fuse to be coupled. As shown in FIG. 2, the terminal 15 is fitted on a resin lance 12a integrated with the fuse containing section 12 by engaging an engaging projection 15a-1 on a metal lance 15a of the terminal 15 with an engaging recess 12a-1 of the resin lance 12a.

Figure 3:
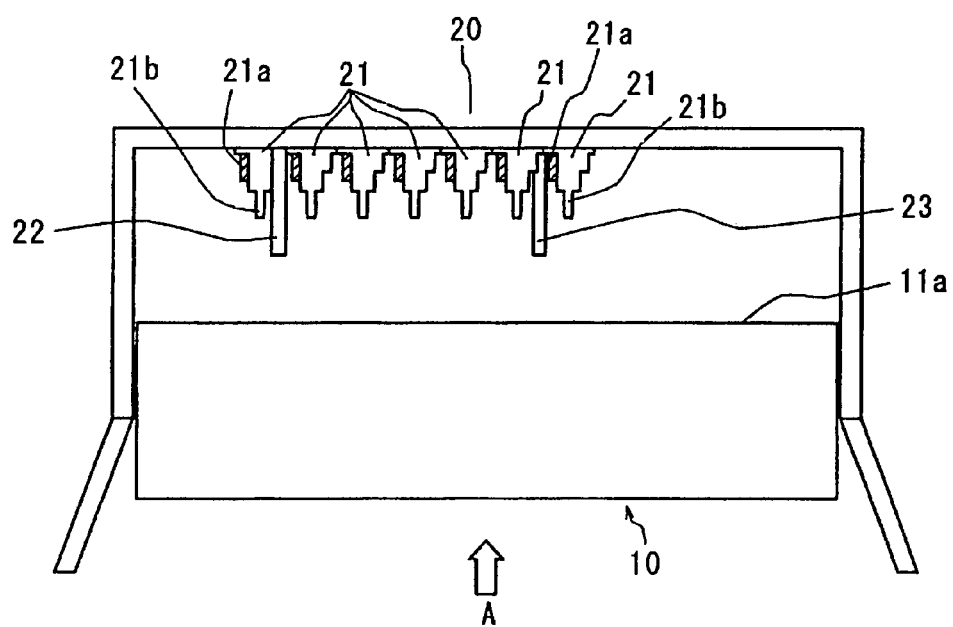
FIG. 3 is a schematic explanatory view, illustrating a process for setting the electrical junction box into a conductivity inspection device.

As described above, the fitting and conductivity inspections for the terminal 15 inserted into and secured to the fuse containing section 12 are carried out by setting the electrical junction box 10 in a conductivity inspection device 20, as shown in FIG. 3. Sensing pin assemblies 21 project into the interior of the fuse containing section 12 to be subjected to the fitting and conductivity inspections. The number of the sensing pin assemblies 21 corresponds to the number of terminals 15 in the fuse containing section 12.

Figure 4:
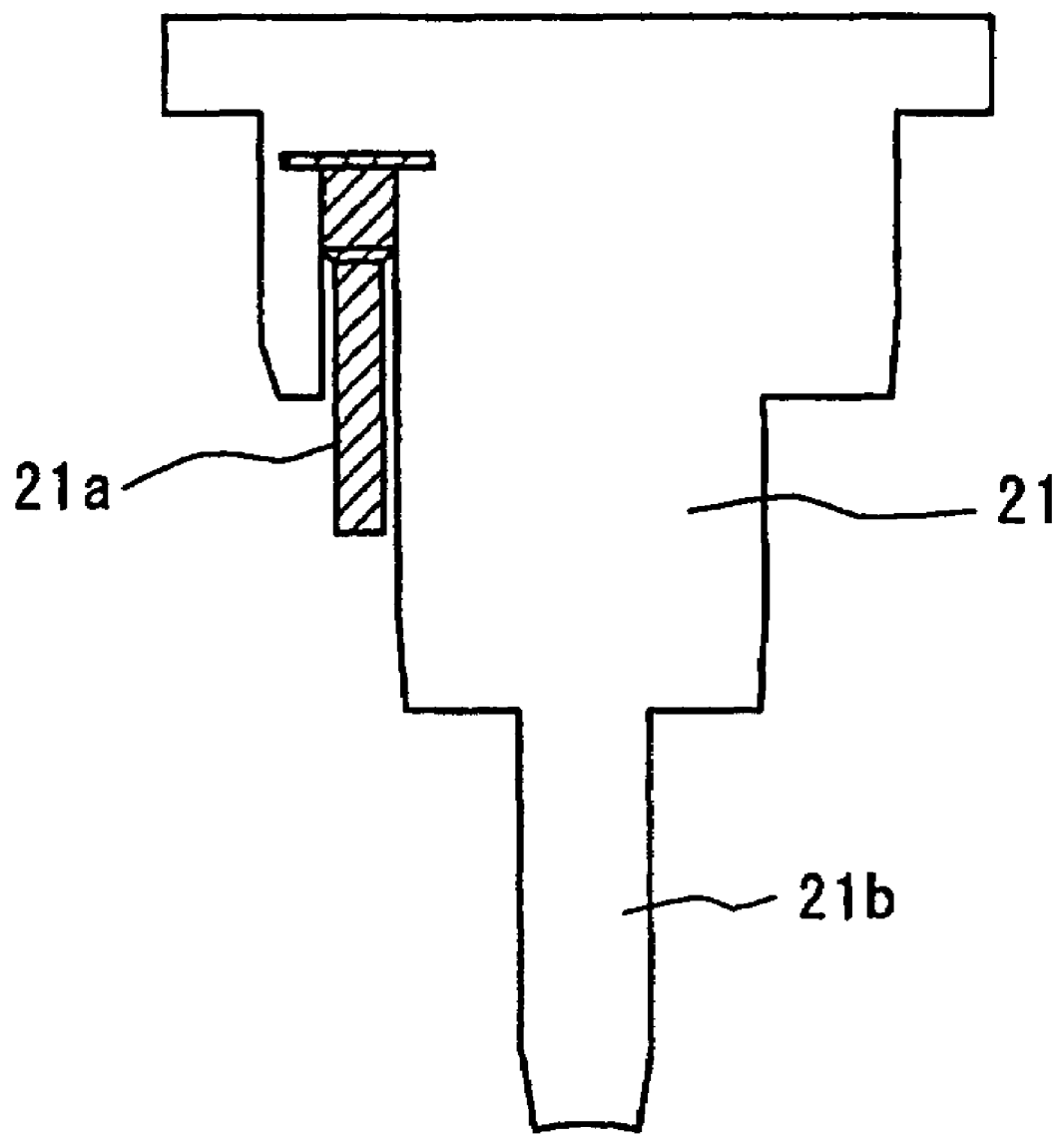
FIG. 4 is an enlarged view of a sensing pin assembly.

As shown in FIG. 4, each of the sensing pin assemblies 21 includes a conductivity sensing pin 21a and a half-fitting sensing pin 21b. As shown in FIG. 3, the conductivity inspection device 20 is further provided with two guide pins 22 and 23 that extend beyond the sensing pin assemblies 21.

As shown in FIG. 1, the electrical junction box 10 is provided at separated empty spaces on the top wall 11a of the casing 11 with guide holes 16 and 17 adapted to receive the guide pins 22 and 23. The guide holes 16 and 17 are formed in the top wall 11a so that the respective sensing pin assemblies 21 can be inserted into the fuse containing section 12 at regular positions when the guide pins 22 and 23 are inserted into the guide holes 16 and 17, respectively. When the sensing pin assemblies 21 are inserted into the fuse containing section 12, the guide pins 22 and 23 project from the guide holes 16 and 17. In this embodiment, clearances between inner peripheral surfaces of the guide holes 16, 17 and outer peripheral surfaces of the guide pins 22, 23 are set to be 0.2 mm (millimeters), but the clearances can be set to be greater or less than 0.2 mm.

Figure 5:
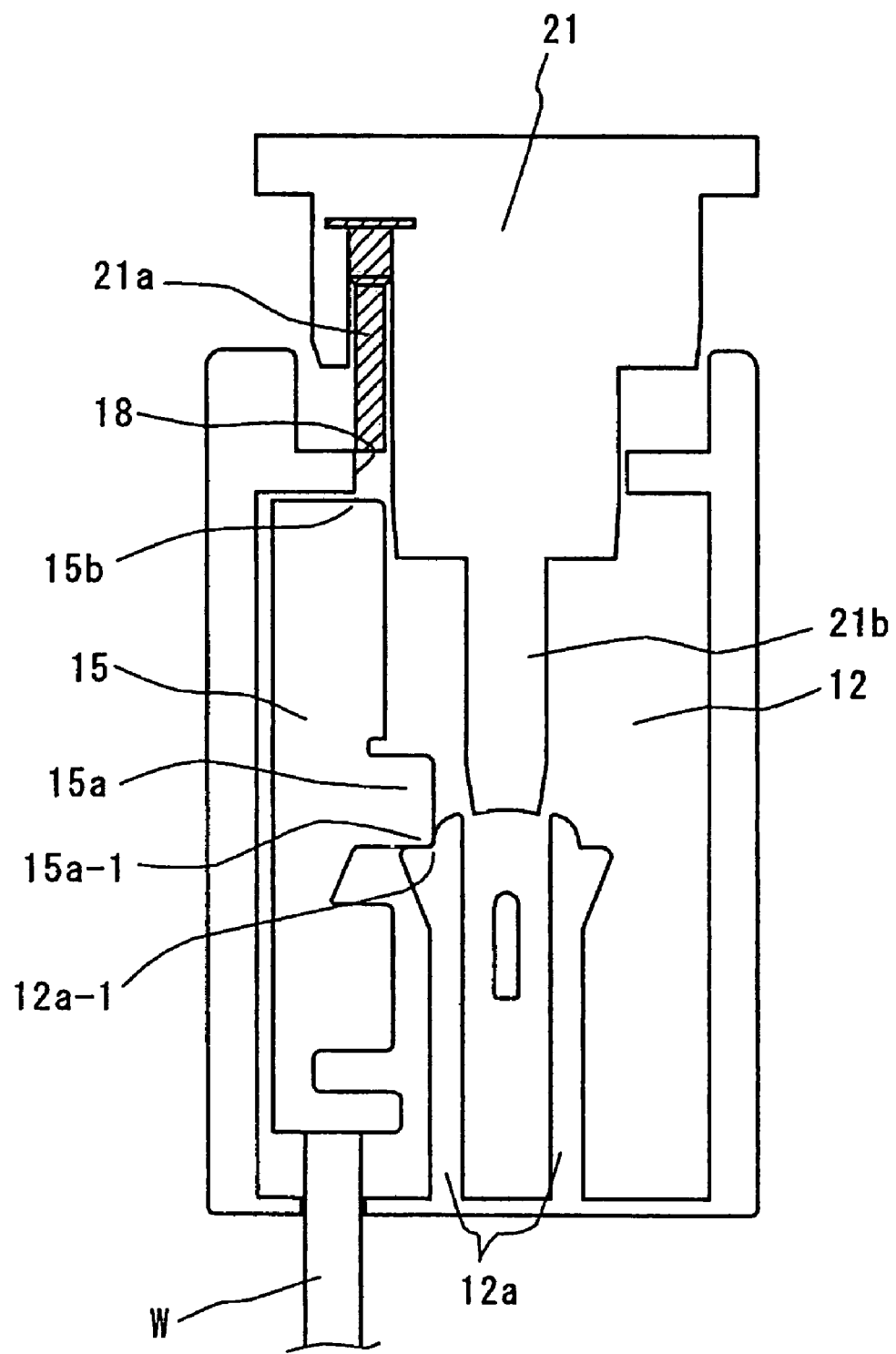
FIG. 5 is an explanatory view, illustrating a state of inserting the sensing pin assembly into the fuse containing section.
Figure 6:
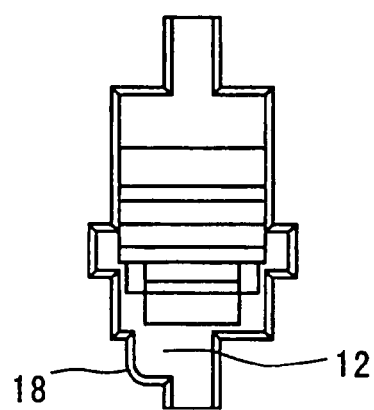
FIG. 6 is a plan view of the fuse containing section.
Figure 7:
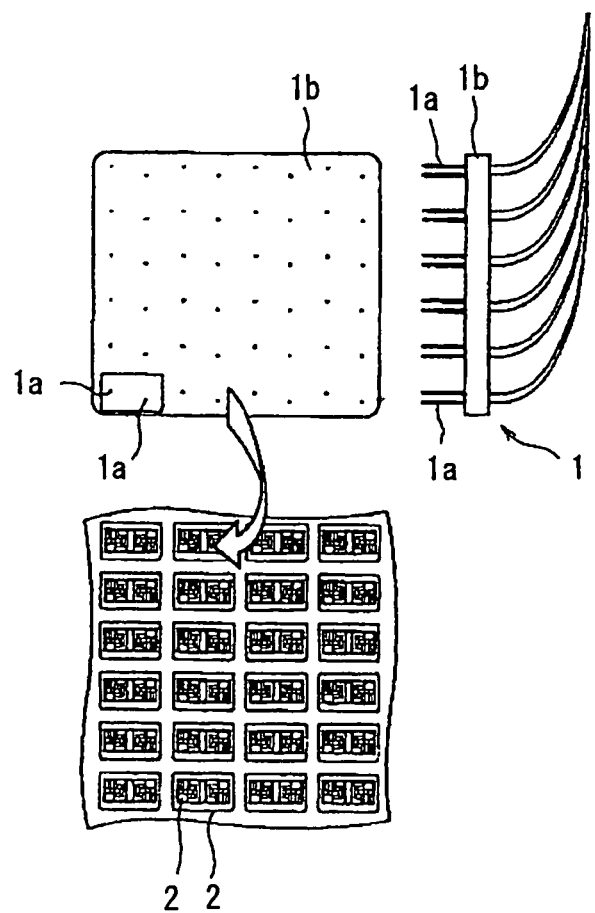
FIG. 7 is an explanatory view of a conventional conductivity inspection device.
Figure 8:
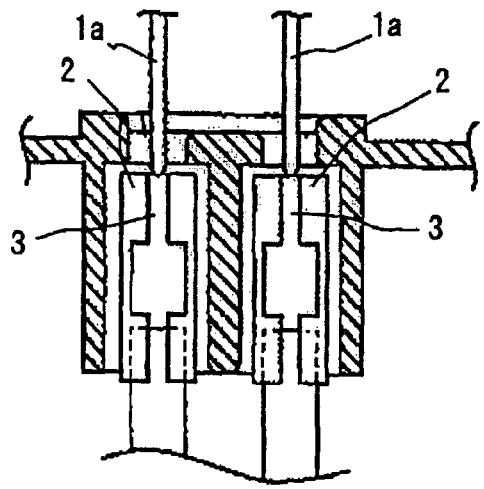
FIG. 8 is an explanatory view of a conventional electrical junction box.
Figure 9:
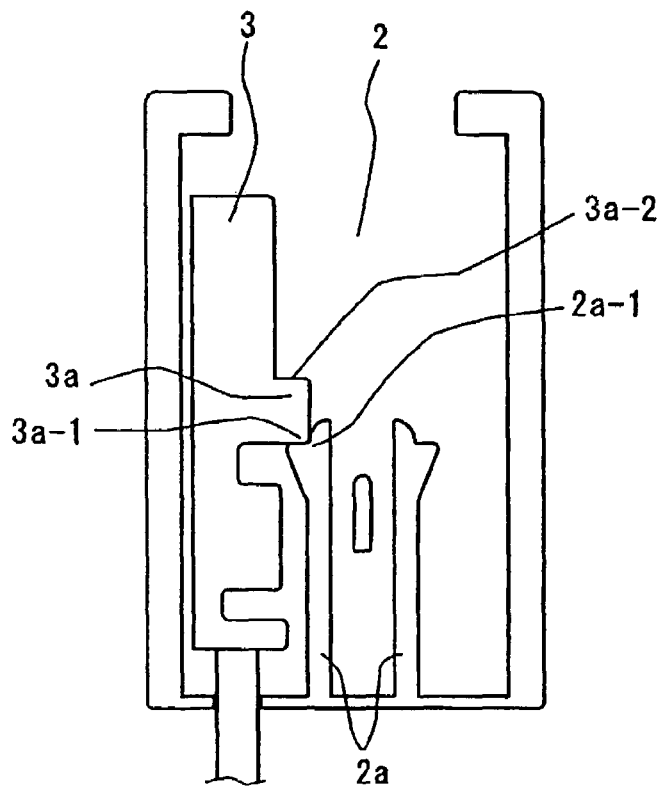
FIG. 9 is an explanatory view, illustrating a fitting state between a terminal and a lance in a fuse containing section in the conventional electrical junction box.
Figure 10:
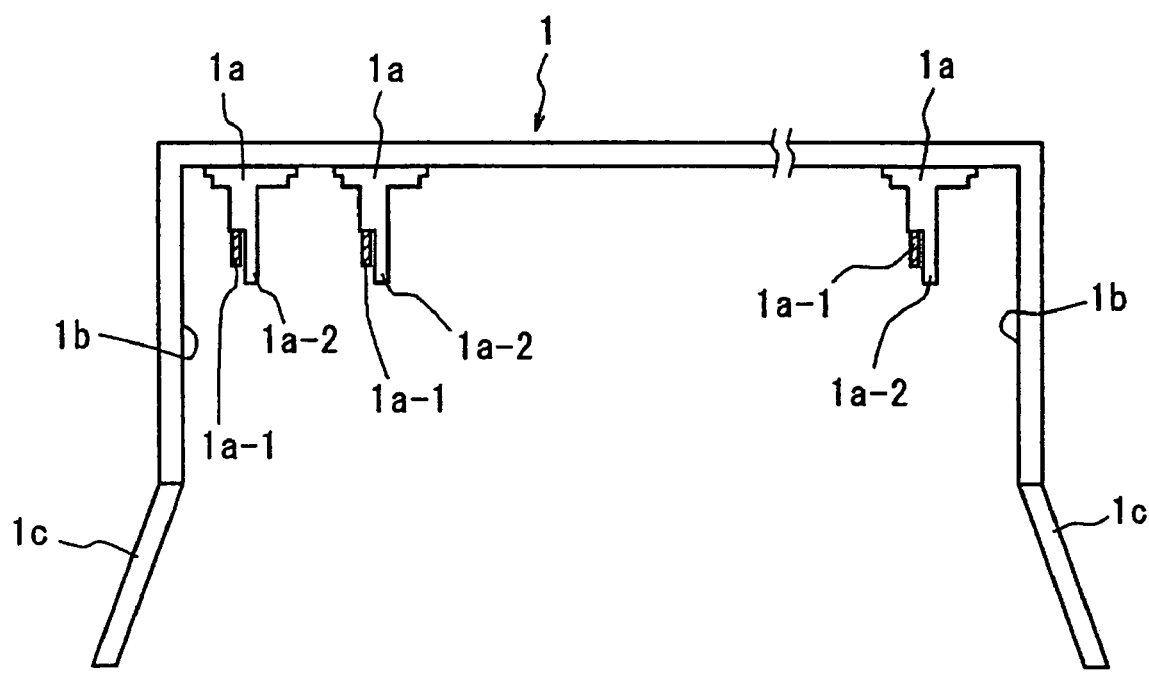
FIG. 10 is an explanatory view of a conventional conductivity inspection device.
Figure 11:
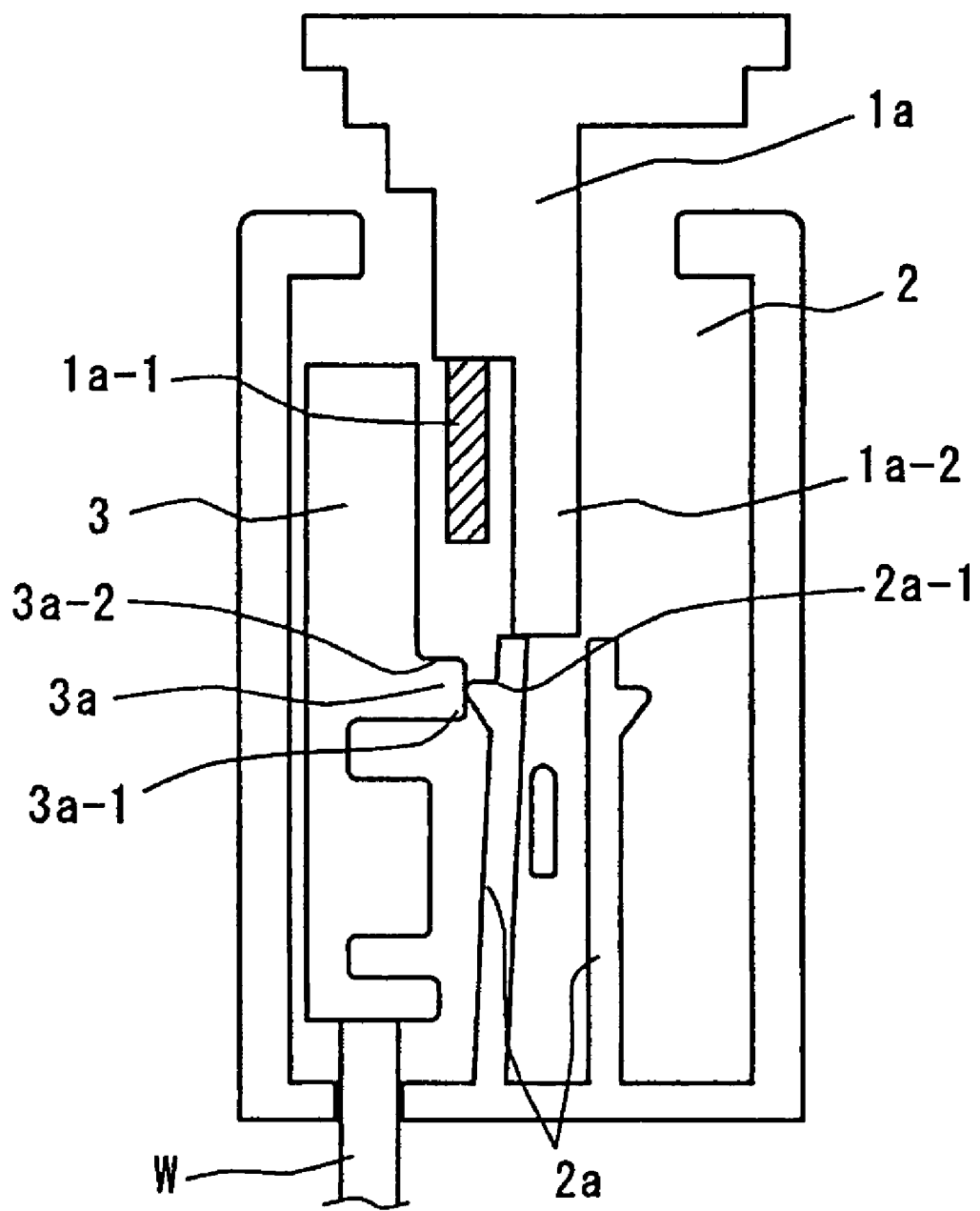
FIG. 11 is an explanatory view, illustrating a state of inserting a sensing pin assembly into the fuse containing section in the conventional electrical junction box.
Figure 12:
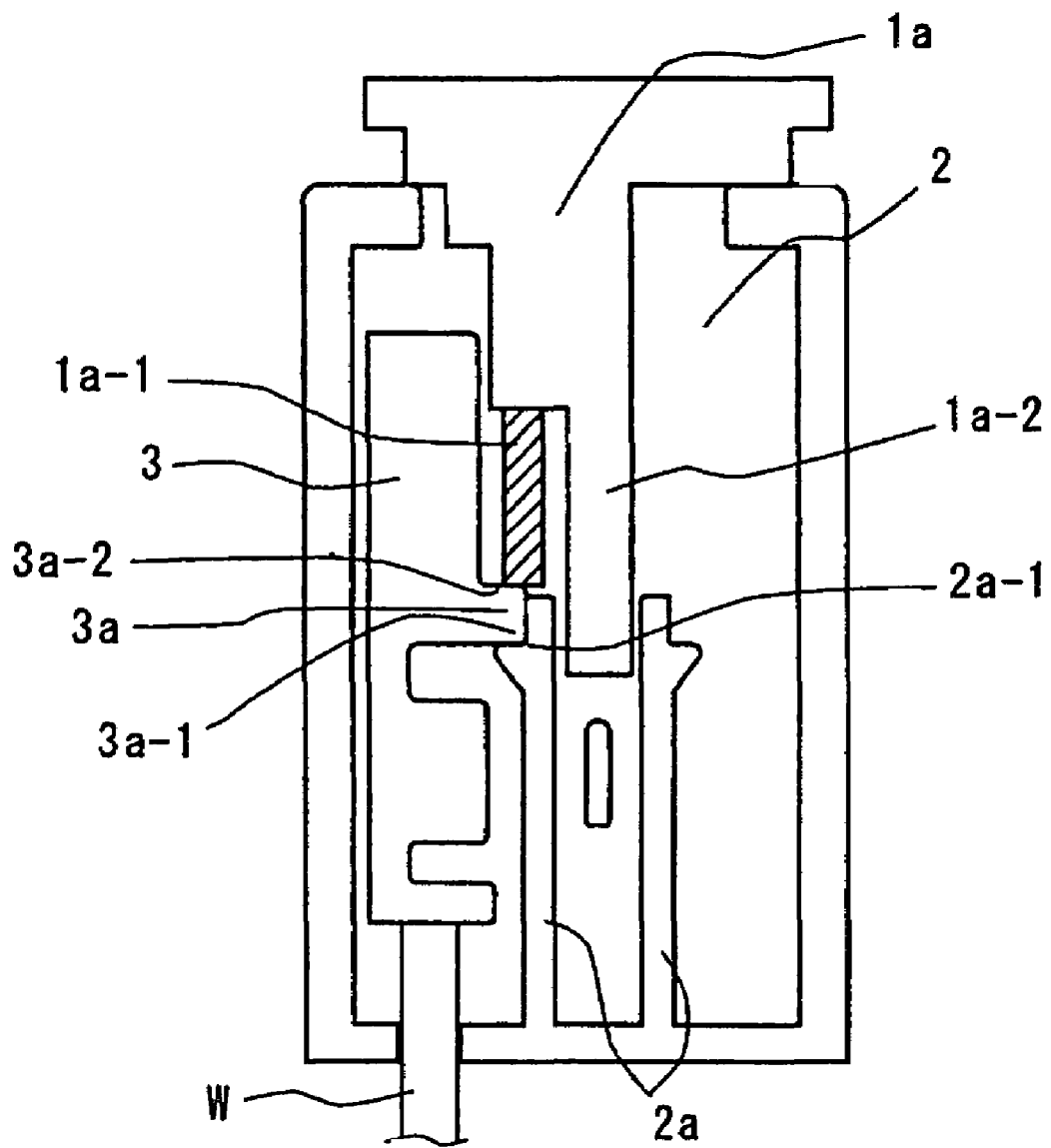
FIG. 12 is an explanatory view, illustrating another state of inserting the sensing pin assembly into the conventional fuse containing section.
Figure 13:
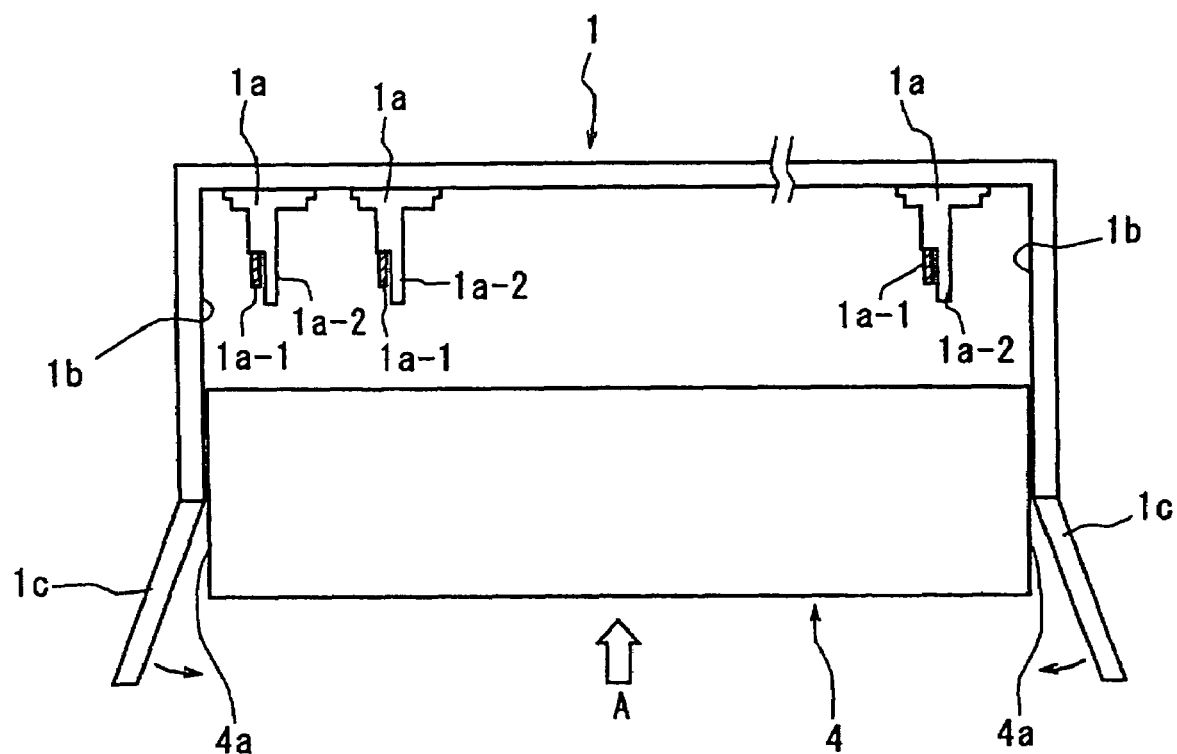
FIG. 13 is a schematic explanatory view, illustrating a process for setting the conventional electrical junction box into a conductivity inspection device.
Figure 14:
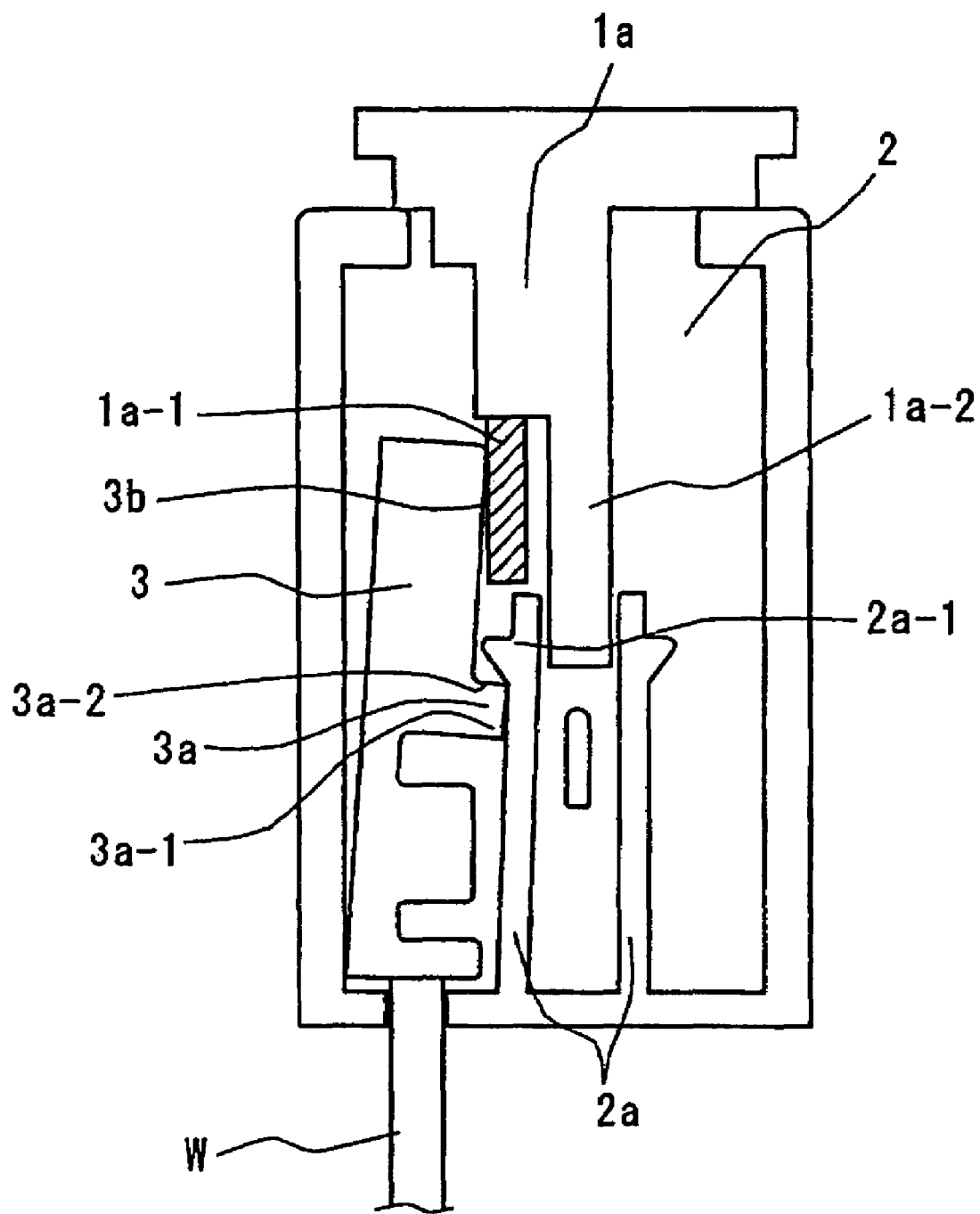
FIG. 14 is an explanatory view, illustrating another state of inserting the sensing pin assembly into the conventional fuse containing section.

As shown in FIGS. 5 and 6, each fuse containing section 12 is provided with an arcuate recess 18 at a distal end side on an inner surface of a peripheral wall. The recess 18 serves to guide the conductivity inspection pin 21a so as to contact with a distal end surface 15b of the terminal 15 so that the recess 18 eventually contacts with an outer peripheral surface of the conductivity sensing pin 21a.

In the case where terminals in the fuse containing section 12 at input and output sides are simultaneously inspected with respect to conductivity and fitting, two recesses 18 may be provided at symmetrical positions of the peripheral wall of the fuse containing section 12.

The conductivity inspection and fitting inspection for the terminals 15 fixed in the fuse containing section 12 will be described below.

First, as shown in FIG. 3, the electrical junction box 10 is moved in a direction shown by an arrow A to set the box 10 in the conductivity inspection device 20. Then, the guide pins 22 and 23 are inserted into the guide holes 16 and 17 to project from the guide holes 16 and 17, respectively. Thus, the respective sensing pin assemblies 21 are inserted in the respective fuse containing sections 12 at the regular positions and the electrical junction box 10 is positioned in the conductivity inspection device 20.

Then, the conductivity sensing pin 21a is inserted into the fuse containing section 12 while contacting the recess 18.

Thus, the engaging projection 15a-1 on the metal lance 15a of the terminal 15 is engaged with the engaging recess 12a-1 of the resin lance 12a; the half-fitting sensing pin 21b enters a gap between the two resin lances 12a so long as the terminal 15 is fitted on the resin lances 12a at the regular positions; the conductivity sensing pin 21a reaches the distal end surface 15b of the terminal 15; and the conductivity sensing can be effected.

As described above, at least two guide holes 16 and 17 are formed in the surface wall of the casing 11 provided with the fuse containing section 12 of the electrical junction box 10; the guide pins 22 and 23 of the conductivity inspection device 20 extend beyond the sensing pin assemblies 21 including the conductivity sensing pins 21a and the half-fitting sensing pins 21b; the guide pins 22 and 23 are inserted into the guide holes 16 and 17 to project from the holes 16 and 17; and the sensing pin assemblies 21 (sensing pins 21a and 21b) are inserted into the respective fuse containing sections 12 at the regular positions without being inserted obliquely. Consequently, it is possible to effectively prevent the sensing pin assemblies 21 (sensing pins 21a and 21b) from being broken and to reliably carry out the half-fitting sensing and conductivity sensing.

As described above, the respective fuse containing sections 12 are provided on the peripheral wall with the arcuate recesses 18 for guiding the conductivity sensing pins 21a; the conductivity sensing pins 21a guided by the recesses 18 can sense the conductivity at the distal end surface 15b of the terminal 15; and the conductivity sensing pins 21a cannot reach the distal end surface 15*b* of the terminal 15 and the conductivity sensing pin 21*a* cannot contact with a side surface of the terminal 15 when the terminal is under the half-fitting position where the metal lance 15*a* of the terminal 15 is arranged below the engaging recess 12*a*-1 of the resin lance 12*a*. Thus, conductivity cannot be detected. Accordingly, even in a half-fitting condition, it is possible to reduce the possibility that a worker will mistakenly judge the assembly to be acceptable. That is, according to the above construction, only in the case where the terminal 15 is fixed in the fuse containing section 12 at the regular position, the conductivity sensing pin 21*a* guided by the recess 18 can reach the distal end surface 15*b* of the terminal 15 to enable the conductivity sensing.

The embodiments described above are intended to be illustrative and not limiting. Various modifications, substitutes and/or improvements are possible within the spirit and scope of the invention.

What is claimed is:

1. An electrical junction box adapted to be set in a conductivity inspection device including at least two guide pins, a half-fitting sensing pin and a conductivity sensing pin, the electrical junction box comprising:

a casing including:

at least two guide holes located at positions corresponding to the at least two guide pins; and a fuse containing section including (1) an arcuate recess provided at a distal end of an inner surface of a peripheral wall of the fuse containing section, the arcuate recess being arcuate as viewed in a direction parallel to the guide holes, and (2) at least two resin lances including an engaging recess, a gap being formed between the two resin lances; and a terminal including an engaging projection, wherein the at least two guide pins are inserted into the at least two guide holes;

wherein the conductivity sensing pin of the conductivity inspection device is inserted into the fuse containing section while contacting the arcuate recess so as to contact a distal end surface of the terminal, the distal end surface being separated from the engaging projection;

wherein the engaging projection of the terminal engages with the engaging recess of at least one of the at least two resin lances; and wherein the half-fitting sensing pin enters the gap between the two resin lances.

2. The electrical junction box according to claim 1, wherein the guide pins extend beyond the conductivity sensing pins and the half-fitting sensing pins.

* * * * *